(12) United States Patent
Cordero-Orille et al.

(10) Patent No.: US 9,562,935 B2
(45) Date of Patent: Feb. 7, 2017

(54) APPARATUS AND METHOD FOR DETECTING A PHASE SEQUENCE IN A VEHICLE

(71) Applicant: Lear Corporation, Southfield, MI (US)

(72) Inventors: Ivan Cordero-Orille, Valls (ES); Laura Castillo Vazquez, Valls (ES)

(73) Assignee: Lear Corporation, Southfield, MI (US)

( * ) Notice: Subject to any disclaimer, the term of this patent is extended or adjusted under 35 U.S.C. 154(b) by 561 days.

(21) Appl. No.: 14/030,144

(22) Filed: Sep. 18, 2013

(65) Prior Publication Data

US 2014/0111185 A1    Apr. 24, 2014

Related U.S. Application Data

(60) Provisional application No. 61/716,068, filed on Oct. 19, 2012.

(51) Int. Cl.
*G01R 25/00* (2006.01)
*H02J 7/02* (2016.01)

(52) U.S. Cl.
CPC ............... *G01R 25/00* (2013.01); *H02J 7/022* (2013.01)

(58) Field of Classification Search
CPC .......... G01R 25/00; G01R 27/08; H01F 38/14
USPC ................. 324/503, 86, 76.77, 252, 260
See application file for complete search history.

(56) References Cited

U.S. PATENT DOCUMENTS

| | | |
|---|---|---|
| 3,825,768 A | 7/1974 | Grygera |
| 3,976,919 A | 8/1976 | Vandevier et al. |
| 4,021,704 A | 5/1977 | Norbeck |
| 4,564,819 A | 1/1986 | Hirose |
| 5,055,769 A * | 10/1991 | Gentile .................. G01R 29/18 324/86 |
| 5,621,296 A | 4/1997 | Werner et al. |
| 5,680,040 A | 10/1997 | Kawai et al. |
| 6,066,932 A | 5/2000 | Fetzer |

(Continued)

FOREIGN PATENT DOCUMENTS

| | | |
|---|---|---|
| CN | 101867211 A | 10/2010 |
| CN | 101872960 A | 10/2010 |

(Continued)

OTHER PUBLICATIONS

Chinese Office Action for corresponding Application No. 201310478809.0, mailed Jun. 23, 2015, 13 pages.

(Continued)

*Primary Examiner* — Vinh Nguyen
*Assistant Examiner* — Alvaro Fortich
(74) *Attorney, Agent, or Firm* — Brooks Kushman P.C.

(57) ABSTRACT

In at least one embodiment, an apparatus for detecting a phase sequence in a vehicle is provided. The apparatus includes a control module for being operatively coupled to a power grid for receiving an incoming power signal therefrom, the incoming power signal providing a first voltage and a second voltage in a vehicle. The control module is configured to determine a phase difference between the first voltage and the second voltage and to determine a signal frequency of the incoming signal to determine a country type for the power grid. The control module is further configured to control a number of switching devices to generate an output voltage signal based on the phase difference and the signal frequency to charge at least one battery on the vehicle.

20 Claims, 6 Drawing Sheets

(56) References Cited

U.S. PATENT DOCUMENTS

| | | | |
|---|---|---|---|
| 7,633,185 B2 | 12/2009 | Rowell | |
| 8,067,932 B2 | 11/2011 | Teodorescu et al. | |
| 8,253,376 B2 | 8/2012 | Gale et al. | |
| 8,823,356 B2* | 9/2014 | Chapman | G01R 19/02 307/127 |
| 2001/0024948 A1* | 9/2001 | Yamashita | H04L 7/042 455/352 |
| 2002/0027432 A1 | 3/2002 | Oohashi | |
| 2007/0200607 A1 | 8/2007 | Ohshima et al. | |
| 2011/0231044 A1* | 9/2011 | Fassnacht | B60L 11/1818 701/22 |
| 2012/0161797 A1* | 6/2012 | Hein | G01R 31/42 324/705 |
| 2012/0242322 A1* | 9/2012 | Chapman | G01R 19/02 324/76.11 |
| 2013/0033234 A1* | 2/2013 | Koritarov | H02J 7/04 320/137 |
| 2013/0057200 A1* | 3/2013 | Potts | H02M 3/33584 320/107 |
| 2013/0181529 A1* | 7/2013 | Tang | H02J 3/383 307/82 |
| 2013/0207482 A1* | 8/2013 | Madawala | H02M 3/33561 307/104 |

FOREIGN PATENT DOCUMENTS

| | | |
|---|---|---|
| CN | 202455130 U | 9/2012 |
| EP | 1901431 A2 | 3/2008 |

OTHER PUBLICATIONS

Chinese Office Action and English translation for corresponding Application No. 201310478809.0, mailed Aug. 22, 2016, 8 pages.

\* cited by examiner

| Type of Grid | If... (Conditions that Identify the Type of Grid) | ...Then (Sequence to be Applied) |
|---|---|---|
| Three-Phase Counter-Clockwise Rotation | Phase L1,L2 = +120deg<br>Frequency = 50Hz | PWM1 Phase = 0deg<br>PWM2 Phase = 120deg<br>PWM3 Phase = 240deg |
| Three-Phase Clockwise Rotation | Phase L1,L2 = -120deg<br>Frequency = 50Hz | PWM1 Phase = 0deg<br>PWM2 Phase = 240deg<br>PWM3 Phase = 120deg |
| Single-Phase (Case 1)<br>L1 - Active Phase<br>L3 - Neutral    or Vice versa | Phase L1,L2 = 0deg<br>Amplitude L2 = 1/2 * Amplitude L1<br>Frequency = 50Hz | PWM1 Phase = 0deg<br>PWM2 OFF<br>PWM3 Phase = 180deg |
| Single-Phase (Case 2)<br>L1 - Active Phase<br>L2 - Neutral    or Vice versa | Phase L1,L2 = 0deg<br>Amplitude L2 = 0<br>Frequency = 50Hz | PWM1 Phase = 0deg<br>PWM2 Phase = 180deg<br>PWM3 OFF |
| Single-Phase (Case 3)<br>L2 - Active Phase<br>L3 - Neutral    or Vice versa | Phase L1,L2 = 0deg<br>Amplitude L2 = Amplitude L1<br>Frequency = 50Hz | PWM1 OFF<br>PWM2 Phase = 0deg<br>PWM3 Phase = 180deg |
| Split-Phase (Case 1)*<br>L1 - Phase A (or B)<br>L2 - Phase B (or A)<br>L3 - Neutral | Phase L1,L2 = 180deg<br>Amplitude L2 = Amplitude L1 = 120VAC<br>Frequency = 60Hz | PWM1 Phase = 0deg<br>PWM2 Phase = 180deg<br>PWM3 OFF |
| Split-Phase (Case 2)<br>L1 - Phase A (or B)<br>L2 - Neutral<br>L3 - Phase B (or A) | Phase L1,L2 = 0deg<br>Amplitude L2 = 1/2 * Amplitude L1<br>Frequency = 60Hz | PWM1 Phase = 0deg<br>PWM2 OFF<br>PWM3 Phase = 180deg |
| Split-Phase (Case 3)*<br>L1 - Neutral<br>L2 - Phase A (or B)<br>L3 - Phase B (or A) | Phase L1,L2 = 180deg<br>Amplitude L2 = Amplitude L1 = 120VAC<br>Frequency = 60Hz | PWM1 OFF<br>PWM2 Phase = 0deg<br>PWM3 Phase = 180deg |

*Split-Phase Cases 1 and 3 are Indistinguishable without Starting the Charger. The System Shall one State and Attempt to Start.
If the Mode is Incorrect, THD Levels will be Very High. Should this Event Occur, SW Shall Select the Other Possible Case and Restart.

APPARATUS AND METHOD FOR DETECTING A PHASE SEQUENCE IN A VEHICLE

CROSS-REFERENCE TO RELATED APPLICATIONS

This application claims the benefit of U.S. provisional Application No. 61/716,068 filed on Oct. 19, 2012, the disclosure of which is incorporated in its entirety by reference herein.

TECHNICAL FIELD

Embodiments disclosed herein generally relate to an apparatus and method for detecting a phase sequence in a vehicle.

BACKGROUND

It is generally known to detect a phase sequence for an electrical circuit. One example of such an implementation is set forth in U.S. Pat. No. 7,633,185 ("the '185 patent") to Rowell.

The '185 patent discloses an apparatus that monitors and controls the application of three phases of alternating voltage to a load by detecting the sequence of the three phases. A switch module is operated, in response to the detected sequence, to ensure that the three phases are properly applied to the load, even if the utility lines are improperly connected. The monitoring also senses loss of a phase in which case the switch module disconnects the application of electricity to the load. The apparatus is capable of being used with different loads that operate at different peak to peak levels of alternating voltage.

SUMMARY

In at least one embodiment, an apparatus for detecting a phase sequence in a vehicle is provided. The apparatus includes a control module for being operatively coupled to a power grid for receiving an incoming power signal therefrom, the incoming power signal providing a first voltage and a second voltage in a vehicle. The control module is configured to determine a phase difference between the first voltage and the second voltage and to determine a signal frequency of the incoming signal to determine a country type for the power grid. The control module is further configured to control a number of switching devices to generate an output voltage signal based on the phase difference and the signal frequency to charge at least one battery on the vehicle.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein.

Figure 1:
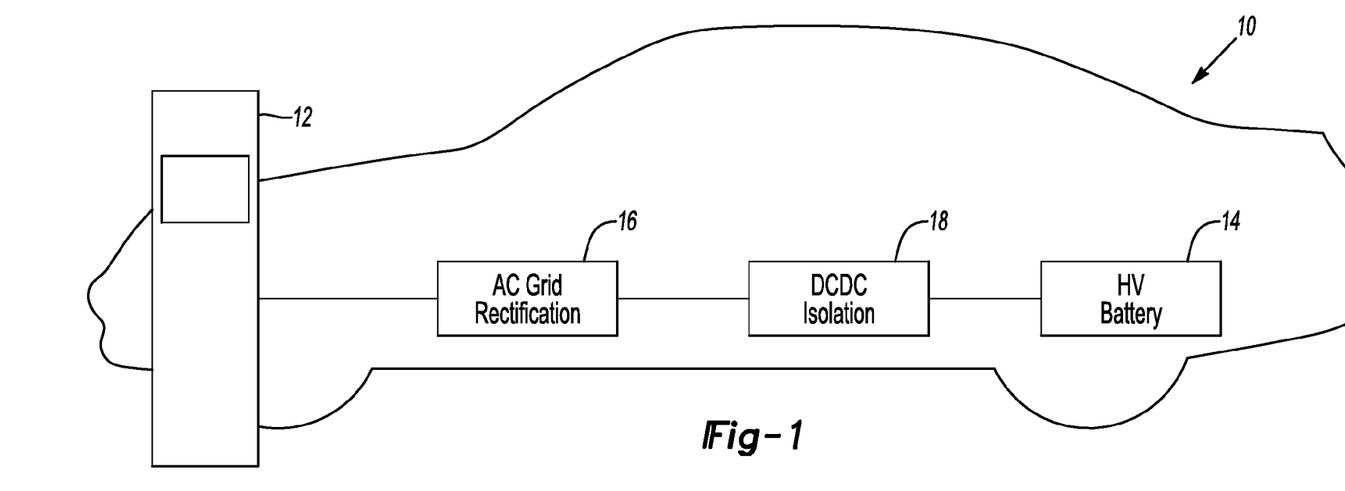
FIG. 1 depicts a vehicle that detects a phase sequence in accordance to one embodiment.

FIG. 1 depicts a vehicle 10 that detects a phase sequence in accordance to one embodiment. A charging station 12 is provided for providing an alternating current (AC) to the vehicle 10. The charging station 12 may comprise an AC power supply (not shown) positioned in an establishment (e.g., home, business, or other place) and an Electric Vehicle Supply Equipment (EVSE) then supplies incoming AC power to the vehicle 10 for charging one or more vehicle batteries 14.

The vehicle 10 further includes an AC grid rectification circuit 16 and a DC to DC isolation circuit 18. The AC grid rectification circuit 16 receives the incoming AC power from the charging station 12 and converts the same into a first DC output. The DC to DC isolation circuit converts the first DC output into a second DC output (e.g., a DC voltage of up to 800V) that is suitable for storage on the one or more batteries 14. In general, the AC power supply may provide up to three phases of AC energy which is then converted into a DC voltage for storage on the one or more batteries 14.

Figure 2:
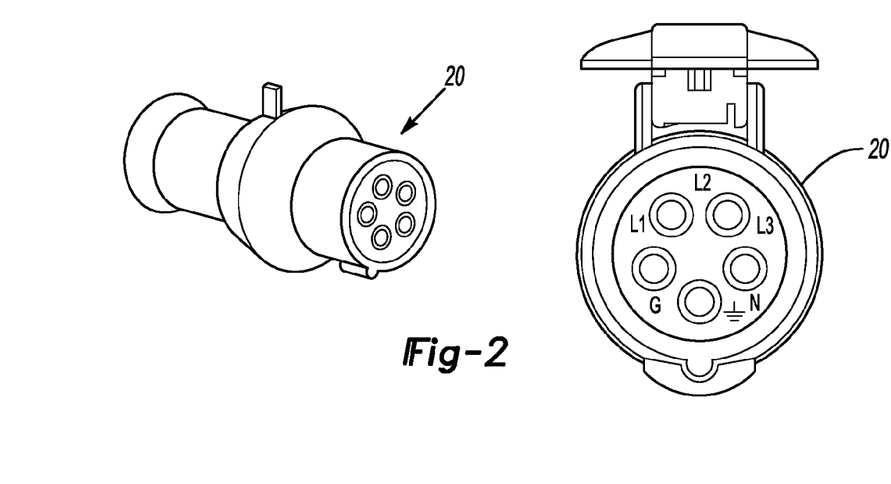
FIG. 2 depicts a socket including a terminal pin-out that complies with an industry standard.

FIG. 2 depicts a socket 20 including a terminal pin-out that complies with industry standard such as, for example, International Electrotechnical Commission (IEC) 60309-1 and 60309-2. While three phase implementations (e.g., L1, L2, and L3) are generally required to comply with the foregoing IEC standards, it may be possible for the socket 20 to include an improper pin out of L1, L2, and L3 which may result in an incorrect phase sequence. Generally, the pin out as shown in the socket 20 enables compliance with IEC 60309-1 and 60309-2. The pin out (e.g., L1, L2, and L3) as shown in socket 20 is indicative of a phase sequence (or phase rotation) which is compliant with IEC 60309-1 and 60309-2.

Embodiments disclosed herein generally provide for a phase sequence detector and adjusts an electrical output (e.g., pulse width modulation (PWM)) that is used to drive a plurality of switching devices in the AC grid rectification circuit 16 for purposes of generating the second DC output which is stored on the one or more batteries 14. In general, the AC grid rectification circuit 16 may be one of many configurations of an active rectifier. This aspect will be discussed in more detail below.

An integrated phase sequence detector is generally implemented in high-end equipment for industrial and domestic markets (e.g., uninterruptable power source (UPS)). The phase sequence for automotive applications may not be specified, particularly for fully-digital-controlled active power factor correction circuits.

The embodiments disclosed herein may eliminate the use of an external phase sequence (or rotation) tester which generally tests whether the three phase grid socket 20 is pinned out to the correct phase sequence. For example, the embodiments disclosed herein may detect the corresponding phase sequence in the event the pinout of the socket is incorrect (or L1, L2, L3 are out of sequence) and adjust the electrical output to the switching devices in the AC grid rectification circuit 16 to compensate for the incorrect phase sequence.

Figure 3:
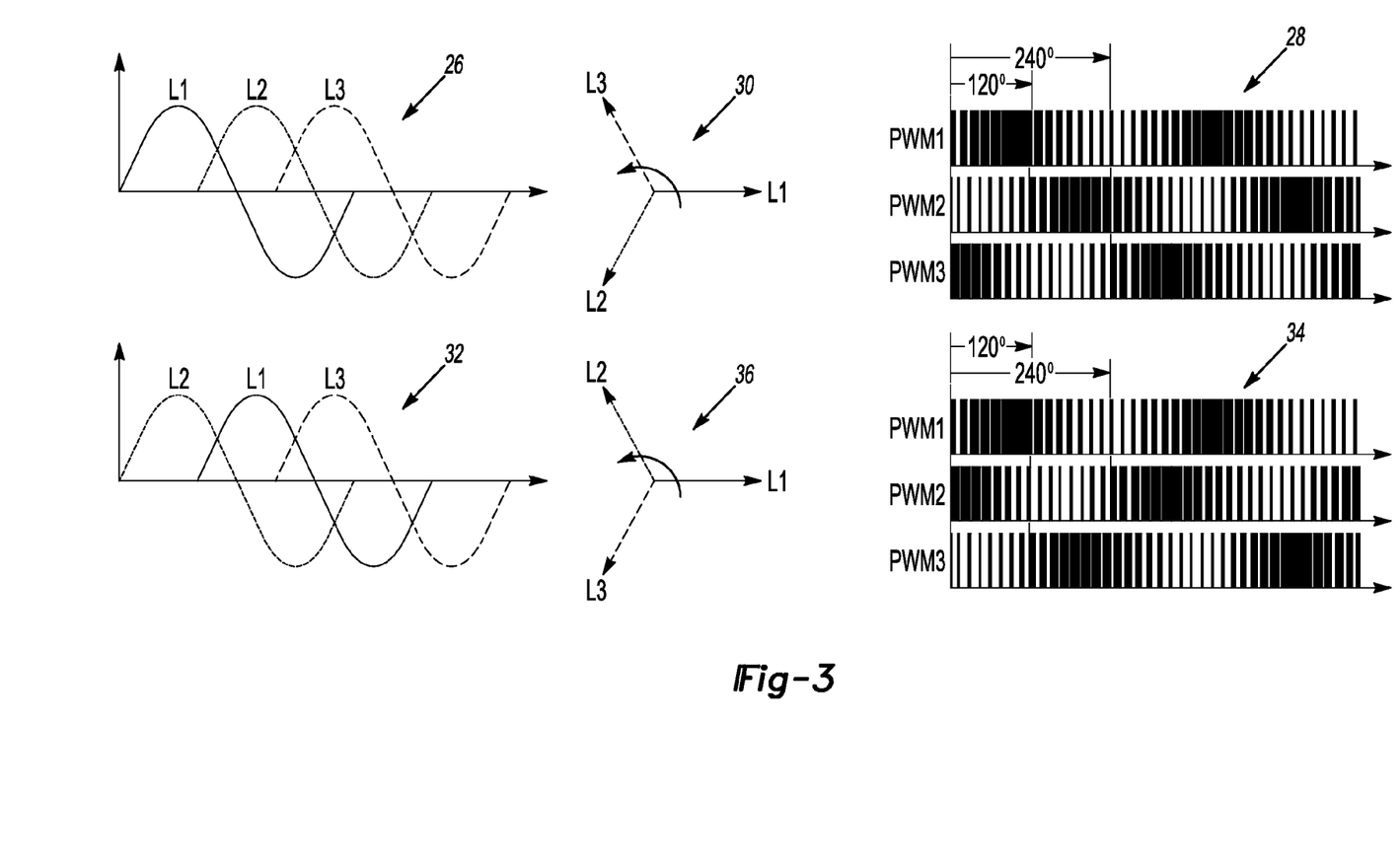
FIG. 3 illustrates waveforms that depict a correct phase sequence and an incorrect phase sequence.

FIG. 3 generally illustrates waveforms that depict a correct phase sequence and an incorrect phase sequence. A first phase sequence waveform 26 generally corresponds to a correct phase sequence. Each phase (e.g., L1, L2, L3) is generally represented by a sinusoidal wavefrom. Each phase generally corresponds to a PWM waveform that is used to drive a switching device as generally shown at 28. The use of the PWM waveform 28 will be discussed in more detail in connection with FIG. 4. At 30, a corresponding phasor diagram, rotating in counterclockwise direction, is shown for the first phase sequence waveform 26. Each phase is generally separated by an angle of 120 degrees.

A second phase sequence waveform 32 generally corresponds to an incorrect phase sequence. Each phase as shown in the second phase sequence waveform 32 generally corresponds to a PWM waveform that is used to drive a switching device as generally shown at 34. At 36, a corresponding phase diagram is shown for the second phase sequence waveform 32.

Figure 4:
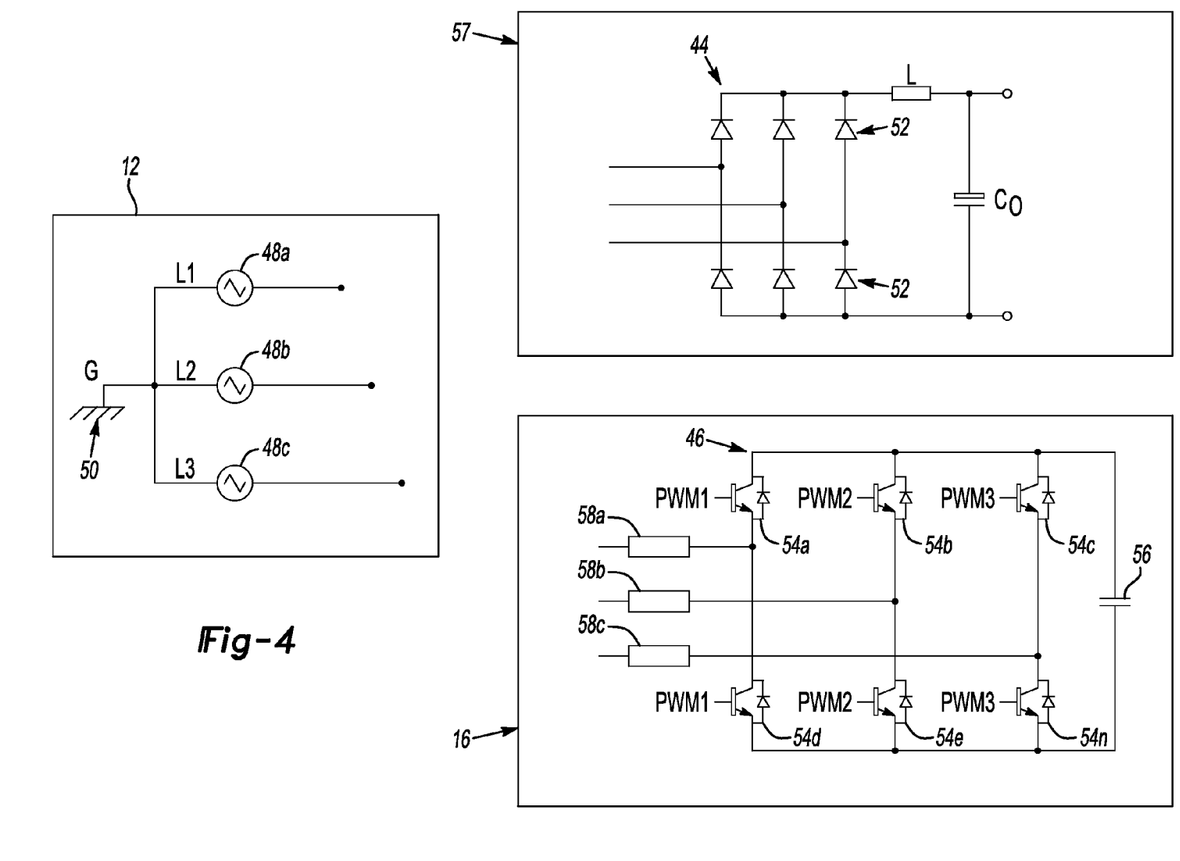
FIG. 4 depicts a detailed circuit of a charging station and an AC grid rectification circuit in accordance to one embodiment.

FIG. 4 depicts a detailed circuit of the charging station 12 and the AC grid rectification circuit 16. In one example, the AC grid rectification circuit 16 may be a conventional three-phase passive rectification circuit 57. The AC grid rectification circuit 16 may also be implemented as an active rectification circuit (hereafter "16") in accordance to one embodiment. The active rectification circuit 16 may be implemented as a boost rectifier circuit 46. In addition, FIG. 4 depicts a simplified scheme of the charging station 12. The passive rectification circuit 57 generally comprises a full rectification circuit 44 that may not be relevant to phase sequence. The charging station 12 includes a plurality of AC power sources 48a-48n ("48') and a ground 50 that provides the AC power to the vehicle 10. Each AC power source 48 generally corresponds to a particular phase. A plurality of diodes 52 is provided for cooperating with the plurality of AC power sources 48 to provide the incoming DC output to the DC to DC isolation circuit 18 (see FIG. 1) as noted above.

The active rectification circuit 16 generally comprises a plurality of switching devices 54a-54n ("54"), a capacitor 56 and a plurality of inductors 58a-58c ("58"). It is recognized that each switching device 54 may be a metal oxide semiconductor field effect transistor (MOSFET) or other suitable device (e.g., insulated-gate bipolar transistor (IGBT), a gate turn-off (GTO) switch, etc.). In addition, other suitable active rectification configurations may be used such as a buck, Vienna, etc. In general, a control module (see FIG. 5) may provide a corresponding PWM waveform (similar to that noted above in connection to FIG. 3) for driving each switching device 54 based on the phase rotation of the incoming AC power as provided from the AC power sources 48. Each switching device 54 cooperates with one another based on the PWM waveform as received from the AC power sources 48 to provide the first DC output. In the event the incoming AC power is provided to the active rectification circuit 16 at an incorrect phase sequence (i.e., pin out is incorrect), then one or more of the switching devices 54 may experience a fault condition, or a power factor operation may be degraded.

Figure 5:
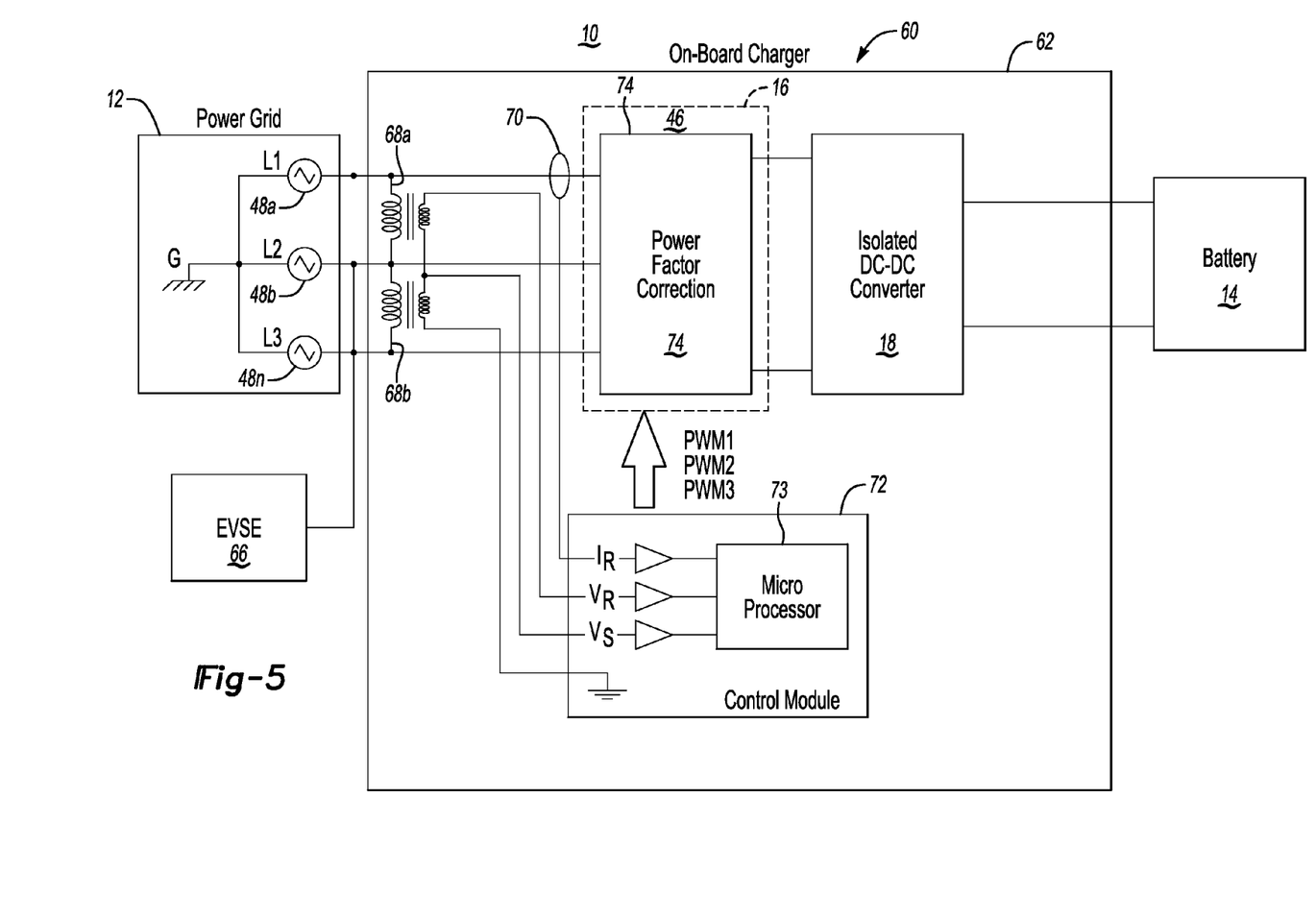
FIG. 5 depicts an apparatus for detecting the phase sequence in a vehicle in accordance to one embodiment.

FIG. 5 depicts an apparatus 60 for detecting the phase sequence in a vehicle 10 in accordance to one embodiment. The apparatus 60 comprises a battery charger 62 that is operably coupled to the charging station 12 (or power grid) for charging the battery 14. Electric vehicle supply equipment (EVSE) 66 is operably coupled to the charging station 12 and the vehicle 10. The EVSE 66 generally comprises terminals, electric vehicle connectors, power outlets and electronics that enable the flow of AC power to the vehicle 10 when it is desired to charge the battery 14.

The battery charger 62 comprises the active rectification circuit 16, the DC to DC isolation circuit 18, at least two transformers 68a-68n ("68") (or a first sensing device 68a and a second sensing device 68n), a current sensor 70, and a control module 72. It is recognized that two pairs of voltage sensors may be used instead of the at least two transformers 68, such as voltage transducers (e.g., hall-effect based) or isolation amplifiers (e.g., optical or magnetically coupled, etc.). Accordingly, the first and the second sensing devices may include the voltage sensors or the voltage transducers. Each transformer 68 senses the AC incoming voltage from line to line and provides a low voltage signal (i.e., low voltage AC signal) to the control module 72. It is recognized that a DC offset may be applied to the low voltage AC signal such that the low voltage AC signal is always positive. In this regard, assume that the low voltage AC signal ranges from −2.5 to +2.5V. Such an offset as noted above provides an output to be between 0 and 5V, thus always positive. The current sensor 70 measures a current (e.g., $I_R$) from the AC input received from the power source 48a. The current sensor 70 provides the measured current, $I_R$ to the control module 72. The current sensor 70 may be relevant for a particular AC grid configuration. The control module 72 includes a microprocessor 73 for receiving the measured current, $I_R$ in addition to various control signals. The control module 72 further receives a first voltage (e.g., $V_R$) from the transformer 68a (or first transforming device) and a second voltage (e.g., $V_S$) from the transformer 68b (or second transforming device). The significance of $I_R$, $V_R$, and $V_S$ will be described in more detail in connection with FIG. 6.

A power factor correction circuit 74 is provided along with the active rectification circuit 16 for minimizing the consumption of reactive power on the incoming AC power from the charging station 12. The control module 72 provides a corresponding PWM waveform for each phase (e.g., PWM1, PWM2, and PWM3) to the active rectification circuit 16 for driving each switching device 54 therein. The DC to DC isolation circuit 18 then converts the first DC output to the second DC output that is suitable for storage on the battery 14.

Figure 6:
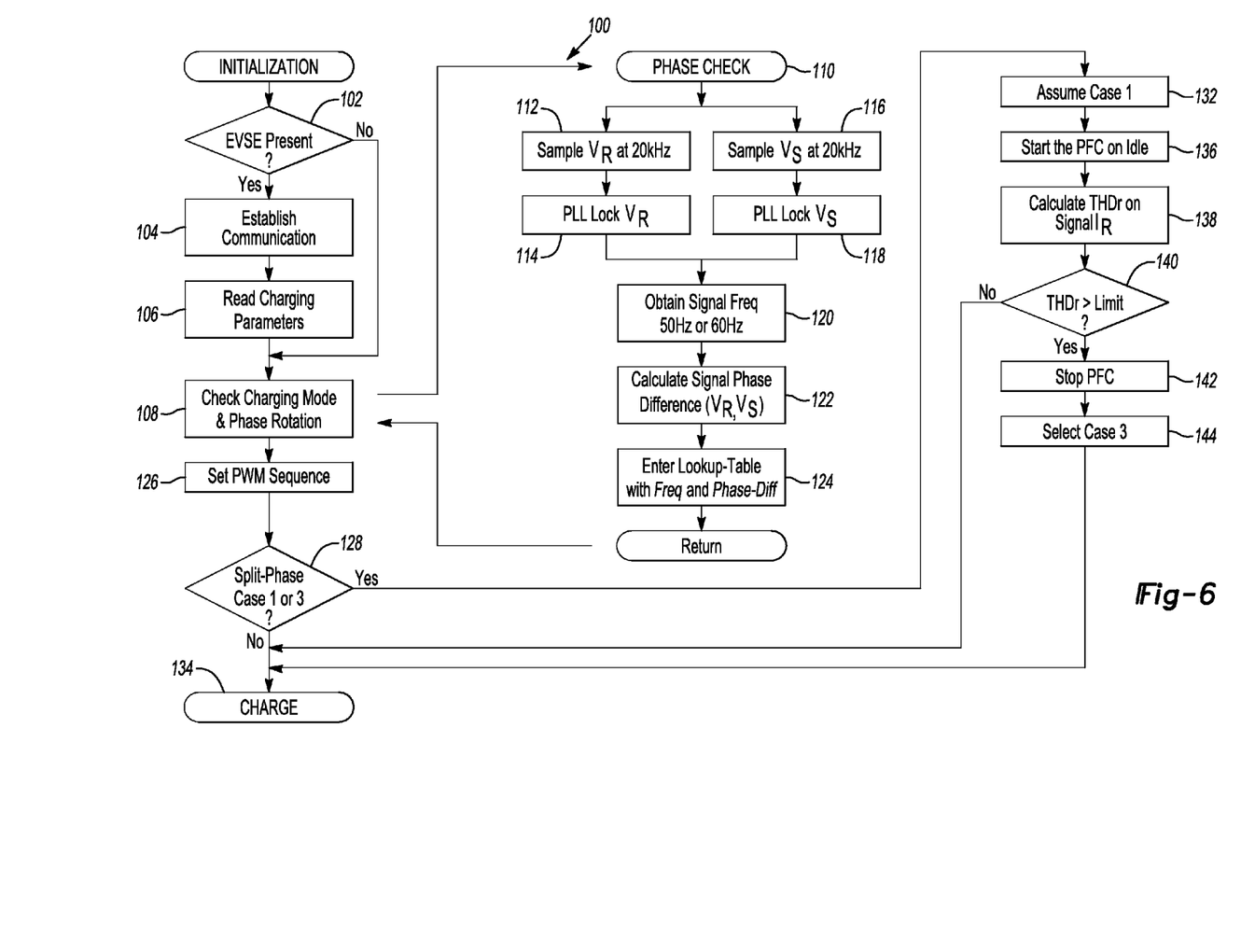
FIG. 6 depicts a method for detecting the phase sequence in accordance to one embodiment.

FIG. 6 depicts a method 100 for detecting the phase sequence in accordance to one embodiment.

In operation 102, the control module 72 determines whether the EVSE 66 is supplying the incoming AC power to the vehicle 10. Such a condition may be true in the event the vehicle 10 is undergoing a charging operation. This operation is performed to ensure that any and all safety devices between the vehicle 10 and a power grid are active. If this condition is true, then the method 100 moves to operation 104. If not, then the method 100 moves to operation 108.

In operation 104, the control module 72 establishes communication with the EVSE 66. For example, according to IEC 61851-1, a pilot wire circuit with PWM modulation (i.e., control pilot) is supplied. Additional wired and/or wireless communication methods may be present according to several international standards.

In operation 106, the control module 72 reads various charging parameters. The pilot wire circuit as noted above according to the IEC 61851-1 generally defines an available current level to be drawn from the charging station 12. Also, the control pilot circuit may provide information on the charging state, such as with relays that are closed, a cable assembly that is connected, etc.

In operation 108, the control module 72 checks the charging mode and the phase rotation or phase sequence of the incoming AC power. For example, the battery charger 62 may be connected to a three-phase AC source, a single phase or a split phase. Also, the battery charger 62 may be connected to several types of AC grids, which vary in line amplitude and base frequency depending on the country. The microprocessor 73 provides a corresponding PWM waveform for each phase (e.g., PWM1, PWM2, and PWM3) to the switching devices 54.

In operation 110, the control module 72 performs the phase rotation or phase sequence check via operations 112, 114, 116, and 118.

In operation 112, the control module 72 samples the first voltage, $V_R$ from the transformer 68a at a corresponding first frequency. In one example, the first frequency may be 20 kHz. It is recognized that other frequencies may be used based on the criteria of a particular implementation. In general, $V_R$ may be in the range of 90 Vrms-400 Vrms. In general, the first frequency is selected to match a task time for the control module 72. Additional sample rates (or frequencies) are possible so long as the sample rate enables the control module 72 an adequate amount of time to reconstruct a real signal.

In operation 114, the control module 72 employs a phase locked loop (PLL) to sync with the incoming AC power that provides $V_R$ at the transformer 68a. This ensures that the control module 72 is synchronized with the power grid.

In operation 116, the control module 72 samples the second voltage, $V_S$ from the transformer 68b at a corresponding second frequency. In one example, the second frequency may be 20 kHz. It is recognized that other frequencies may be used based on the criteria of a particular implementation. The second frequency may vary so long as it provides an adequate sample rate to enable the control module 72 an adequate amount of time to reconstruct the real signal. In general, $V_S$ may be in the range of 90 Vrms-400 Vrms.

In operation 118, the control module 72 employs the PLL to sync with the incoming AC power that provides $V_S$ at the transformer 68b. As noted above, this ensures that the control module 72 is synchronized with the power grid.

In operation 120, the control module 72 determines a signal frequency of the incoming AC power to determine the country in which the grid is providing power from. For example, power sources 48 in the European Union are known to provide the incoming AC power at 50 Hz. Power sources 48 in United States are known to provide the incoming AC power at 60 Hz.

In operation 122, the control module 72 determines the phase difference between $V_R$ and $V_S$. This value is generally indicative of the phase sequence.

Figure 7:
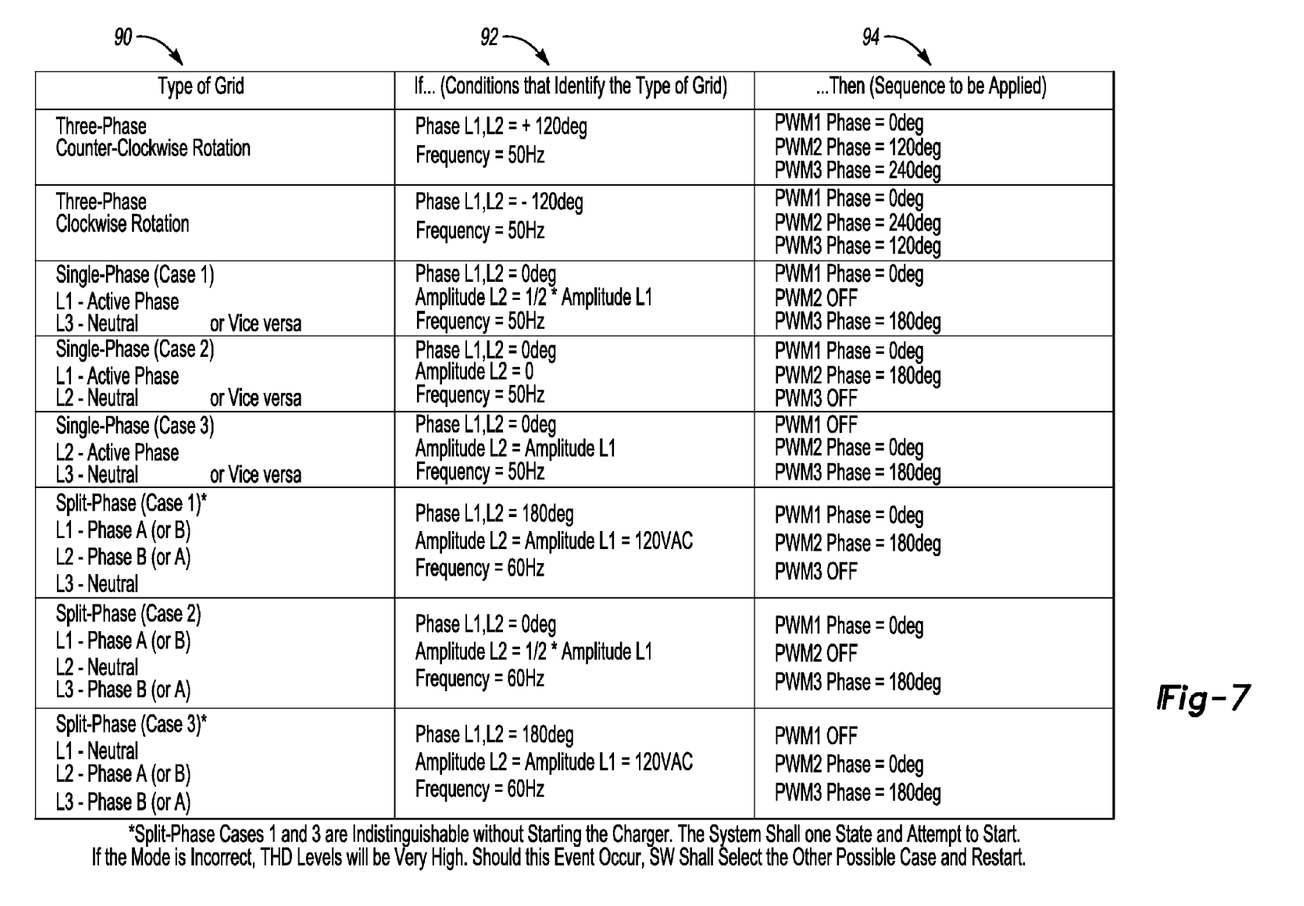
FIG. 7 depicts a look up table for detecting connected phases and the phase sequence and for generating an output based on a detected phase configuration.

In operation 124, the control module 72 accesses a look up table (LUT) to ascertain the phase sequence based on phase difference as determined in operation 122 and the frequency as determined in operation 120. FIG. 7 generally depicts the contents that may comprise the LUT as stored in the control module 72.

For example, the LUT may include information regarding (i) "TYPE OF GRID" as generally shown at 90 (see FIG. 7), (ii) the phase difference between L1 and L2 which are indicative of the type of grid, the corresponding amplitude of L1 and L2, and the frequency (e.g., 50 Hz or 60 Hz) (or U.S.A or Japan) all as generally shown at 92 (see FIG. 7); and (iii) the type of PWM waveform to apply to the various switching devices 54 within the active rectification circuit 16 as generally shown at 94 (see FIG. 7).

In response to the control module 72 determining the information of operation 124, the method 100 then proceeds back to operation 126.

In operation 126, the control module 72 sets the corresponding PWM waveform as generally shown at 94 in FIG. 7 based on the phase difference and frequency (i.e., based on the power grid detected).

In operation 128, the control module 72 determines whether the type of grid detected based on the phase difference and frequency (see 90 and 92 of FIG. 7) corresponds to a split-phase case 1 or case 3. In general, the split phase case 1 and split phase case 3 grids are indistinguishable unless the vehicle charger has been started. It is desirable to understand the type of grid the vehicle 10 is coupled to prior to initiating the charging operation (e.g., prior to driving the switching devices 54 with the various PWM waveforms) to account for the phase sequence so that the switching devices 54 are not damaged.

In the event the type of grid corresponds to the split-phase case 1 or split-phase case 3, then the method 100 moves to operation 132. In the event this condition is false, then the method 100 move to operation 134 to enable the vehicle 10 to undergo a charging operation since the corresponding type of grid is known and it is further known how to drive the switching devices 54 with the proper PWM waveform to account for the type of power grid.

In operation 132, the control module 72 assumes that the grid is a split phase case 1 or arbitrarily selects the split phase case 1. It is recognized that the control module may alternatively assume that the grid is the split phase case 3 or arbitrarily select the split phase case 3.

In operation 136, the control module 72 controls the PFC 74 to operate in an idle mode. While in the idle mode, the PFC 74 will draw power from an internal power supply and exhibit losses. The internal power supply will draw power from the grid. While in the idle mode, various stages of auxiliary circuits (not shown) within the PFC 74 may be activated with power from the internal power supply while other stages within the PFC 74 will not be activated. For example, the PFC 74 will draw power to supply auxiliary and control circuits (not shown) and various switching power semiconductors and passive components (capacitors, inductors, etc.) will exhibit losses in the idle mode. The DC/DC isolation circuit 18 is not active while the PFC 74 is in the idle mode as there is no power being transferred from the power grid to the battery 14.

In operation 138, the control module 72 calculates a total harmonic distortion (THD) based on the current sensed from the current sensor 70 (or the control module 72 receives the current and calculates the THD). The THD is generally defined as the root mean square (RMS) value of the total harmonics of the current signal, divided by the RMS value of its fundamental signal.

In operation 140, the control module 72 determines whether the value THD exceeds a predetermined limit (or threshold). If this condition is true, then the method 100 proceeds to operation 142. If not, then the method 100 proceeds to operation 134. In general, if this condition is false, this condition indicates that the split phase case 1 is the type of grid in which the vehicle 10 is operably coupled to and the assumption performed in operation 132 is correct. It is recognized that while the PFC 74 is in the idle state, the control module 72 may provide the PWM waveform (or sequence) to the PFC 74, but no power is transferred to the battery 14 as the DC/DC isolation circuit 18 is switched off in this condition.

In operation 134, the control module 72 activates the PFC 74 and provides the PWM waveforms to the switching devices 54 in accordance to those corresponding to the split-phase case 1.

In operation 142, the control module 72 controls the PFC 74 to stop as the type of grid as assumed in operation 132 is incorrect.

In operation 144, the control module 72 selects the split phase case 3.

In operation 134, the control module 72 activates the PFC 74 and provides the PWM waveforms to the switching devices 54 in accordance to those corresponding to the identified AC grid configuration and phase sequence.

In general, the embodiments as disclose herein may (i) not require an external phase sequence tester to check charging point readiness; (ii) detect the sequence and adapt to each and any case; (iii) not need to change home plug wiring in case of an incorrect phase rotation or sequence; (iv) provide for increased robustness by using an installation independent implementation; and (v) may be applicable to three phase on board battery chargers with digital control.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for detecting a phase sequence in a vehicle, the apparatus comprising:
    a control module for being operatively coupled to a first sensing device and a second sensing device in a vehicle that receives an incoming power signal from a power grid, the first sensing device being arranged to provide a first voltage in response to the incoming power signal and the second sensing device being arranged to provide a second voltage in response to the incoming power signal, the control module being configured to:
        determine a phase difference between the first voltage and the second voltage;
        control a number of switching devices to generate an output voltage signal based on the phase difference to charge at least one battery on the vehicle; and
        determine whether the power grid corresponds to one of a first split phase case and a second phase split case prior to controlling the number of switching devices to generate the output voltage signal.

2. The apparatus of claim 1 wherein the control module is further configured to determine a signal frequency of the incoming power signal to determine a country type for the power grid.

3. The apparatus of claim 2 wherein the control module is further configured to control the number of switching devices to generate the output voltage signal based on the phase difference and the signal frequency.

4. The apparatus of claim 2 wherein the control module is further configured to generate a number of pulse width modulated (PWM) signals based on the phase difference and the signal frequency to control the number of switching devices to generate the output voltage signal.

5. The apparatus of claim 1 wherein the control module is further configured to determine whether the power grid corresponds to the one of the first split phase case and the second split phase case based at least on the phase difference prior to controlling the number of switching devices to generate the output voltage signal.

6. The apparatus of claim 5 wherein the control module is further configured to arbitrarily select the one of the first split phase case and the second split phase case prior to controlling the number of switching devices.

7. The apparatus of claim 6 wherein the control module is further configured to measure current from the incoming power signal in response to arbitrarily selecting the one of the first split phase case and the second split phase case and to compare the measured current to a threshold to determine whether the power grid corresponds to the one of the first split phase case and the second split phase case.

8. An apparatus for detecting a phase sequence in a vehicle, the apparatus comprising:
    a control module for being operatively coupled to a power grid for receiving an incoming power signal therefrom, the incoming power signal providing a first voltage and a second voltage in a vehicle, the control module being configured to:
        determine a phase difference between the first voltage and the second voltage;
        determine a signal frequency of the incoming power signal to determine a country type for the power grid;
        control a number of switching devices to generate an output voltage signal based on the phase difference and the signal frequency to charge at least one battery on the vehicle; and
        determine whether the power grid corresponds to one of a first split phase case and a second split phase case prior to controlling the number of switching devices to generate the output voltage signal.

9. The apparatus of claim 8 wherein the control module is further configured to generate a number of pulse width modulated (PWM) signals based on the phase difference and the signal frequency to control the number of switching devices to generate the output voltage signal.

10. The apparatus of claim 8 wherein the control module is further configured to determine whether the power grid corresponds to one of a first split phase case and a second split phase case prior to controlling the number of switching devices to generate the output voltage signal.

11. The apparatus of claim 10 wherein the control module is further configured to arbitrarily select the one of the first split phase case and the second split phase case prior to controlling the number of switching devices.

12. The apparatus of claim 11 wherein the control module is further configured to measure current from the incoming power signal in response to arbitrarily selecting the one of the first split phase case and the second split phase case and to compare the measured current to a threshold to determine whether the power grid corresponds to the one of the first split phase case and the second split phase case.

13. A method for detecting a phase sequence in a vehicle, the method comprising:
receiving an incoming power signal from a power grid;
providing a first voltage from the incoming power signal at a first sensing device;
providing a second voltage from the incoming power signal at a second sensing device;
determining a phase difference between the first voltage and the second voltage;
controlling a number of switching devices to generate an output voltage signal based on the phase difference to charge at least one battery on the vehicle; and
determining whether the power grid corresponds to one of a first split phase case and a second split phase case prior to controlling the number of switching devices to generate the output voltage signal.

14. The method of claim 13 further comprising determining a signal frequency of the incoming power signal to determine a country type for the power grid.

15. The method of claim 14 further comprising controlling the number of switching devices to generate the output voltage signal based on the phase difference and the signal frequency.

16. The method of claim 14 further comprising generating a number of pulse width modulated (PWM) signals based on the phase difference and the signal frequency to control the number of switching devices to generate the output voltage signal.

17. The method of claim 13 further comprising determining whether the power grid corresponds to one of the first split phase case and the second split phase case based at least on the phase difference prior to controlling the number of switching devices to generate the output voltage.

18. The method of claim 17 further comprising arbitrarily selecting the one of the first split phase case and the second split phase case prior to controlling the number of switching devices.

19. The method of claim 17 further comprising:
measuring current from the incoming power signal in response to arbitrarily selecting the one of the first split phase case and the second split phase case; and
comparing the measured current to a threshold to determine whether the power grid corresponds to the one of the first split phase case and the second split phase case.

20. The method of claim 13 wherein the phase difference is indicative of the power grid corresponding to one of a three phase grid, a first single-phase case, a second single-phase case, a third single-phase case, a first split phase case, a second split phase case, and a third split phase case.

* * * * *